United States Patent
Yuhn

(10) Patent No.: US 7,361,580 B2
(45) Date of Patent: Apr. 22, 2008

(54) SEMICONDUCTOR DEVICE AND MANUFACTURING METHOD THEREOF

(75) Inventor: Moon Jae Yuhn, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 11/473,693

(22) Filed: Jun. 23, 2006

(65) Prior Publication Data

US 2006/0292768 A1    Dec. 28, 2006

(30) Foreign Application Priority Data

Jun. 23, 2005    (KR) .................... 10-2005-0054552

(51) Int. Cl.
*H01L 21/3205* (2006.01)
(52) U.S. Cl. ................ 438/592; 438/763; 257/E21.177
(58) Field of Classification Search ................ 438/588, 438/763, 592; 257/E29.128, E29.139, E29.155, 257/E21.177
See application file for complete search history.

(56) References Cited

U.S. PATENT DOCUMENTS

| 5,652,156 | A  | * | 7/1997 | Liao et al. ................... 438/161 |
| 5,767,004 | A  | * | 6/1998 | Balasubramanian et al. .............................. 438/592 |
| 6,624,483 | B2 | * | 9/2003 | Kurata ....................... 257/387 |
| 6,730,976 | B2 | * | 5/2004 | Harada et al. ............... 257/408 |
| 6,876,045 | B2 | * | 4/2005 | Takagi ........................ 257/408 |
| 2003/0203610 | A1 | * | 10/2003 | Gilton et al. ............... 438/592 |
| 2006/0073688 | A1 | * | 4/2006 | Martin et al. ............... 438/585 |

\* cited by examiner

*Primary Examiner*—Trung Dang
(74) *Attorney, Agent, or Firm*—Saliwanchik, Lloyd & Saliwanchik

(57) ABSTRACT

A semiconductor device and a manufacturing method thereof are provided. The semiconductor device includes a substrate, a gate insulating layer, a gate electrode, an oxide layer, and sidewalls. The gate insulating layer is formed on the substrate. The gate electrode includes an upper layer and a lower layer stacked on the gate insulating layer. The oxide layer is formed on the gate electrode. The lower layer and the upper layer can have different oxidation rates. The sidewalls are formed on the oxide layer.

19 Claims, 2 Drawing Sheets

SEMICONDUCTOR DEVICE AND MANUFACTURING METHOD THEREOF

RELATED APPLICATION

This application claims the benefit under 35 U.S.C. §119(e) of Korean Patent Application Number 10-2005-0054552, filed Jun. 23, 2005, which is incorporated herein by reference in its entirety.

FIELD OF THE INVENTION

The present invention relates to a manufacturing method of a semiconductor device, and more particularly, to a method of forming transistors.

BACKGROUND OF THE INVENTION

Generally, a semiconductor device has a substrate with a source region and a drain region separated by a channel region, and an insulating layer and a gate electrode sequentially stacked on the channel region. A three-terminal transistor uses the source region, the drain region, and the gate electrode as its terminals.

To form a transistor on a semiconductor substrate, a gate insulating layer is first formed on top of a substrate, and a conductive material such as a polysilicon layer is formed on top thereof.

Then, the gate insulating layer and the polysilicon layer are etched to form a gate electrode. Here, the corners of the gate electrode are rounded by the characteristics of the polysilicon.

Then, the semiconductor device is heat treated to form an oxide layer on the exposed surface of the gate electrode, and impurity ions are implanted to form a low density impurity region.

Next, a nitride layer is applied to the entire surface of the semiconductor device. Then, the nitride layer and the oxide layer are etched to form sidewalls on the gate electrode.

Once the sidewalls are formed, impurity ions are implanted into the semiconductor substrate to form a high density impurity region, completing the transistor.

However, in the prior art, the regions of a semiconductor substrate where the impurity ions are implanted, overlap with a lower region of the gate electrode. Accordingly, current may leak from the transistor. Consequently, the reliability of the semiconductor device decreases.

SUMMARY OF THE INVENTION

Accordingly, the present invention is directed to a semiconductor device and a manufacturing method thereof that addresses and/or substantially obviates one or more problems, limitations and/or disadvantages of the prior art.

An object of the present invention is to provide a semiconductor device and a manufacturing method thereof that form a gate electrode using layers with respectively different rates of oxidation, to improve the reliability and capability of the semiconductor device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a semiconductor device incorporating: a substrate; a gate insulating layer formed on the substrate; a gate electrode including an upper and a lower layer stacked on the gate insulating layer; an oxide layer formed on the gate electrode; and a sidewall formed on the sides of the gate electrode.

In another aspect of the present invention, there is provided a manufacturing method of a semiconductor device, including: forming a gate insulating layer on a substrate; forming a lower layer and an upper layer on the gate insulating layer; etching the upper layer and the lower layer to form a gate electrode; etching the gate insulating layer by using the gate electrode as a mask; forming an oxide layer by performing a heat treatment on the substrate and the gate electrode; and forming a high density impurity region by implanting impurity ions into the semiconductor substrate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIGS. 1 through 4 are sectional views showing a manufacturing process of a semiconductor device according to an embodiment of the present invention.

Figure 1:
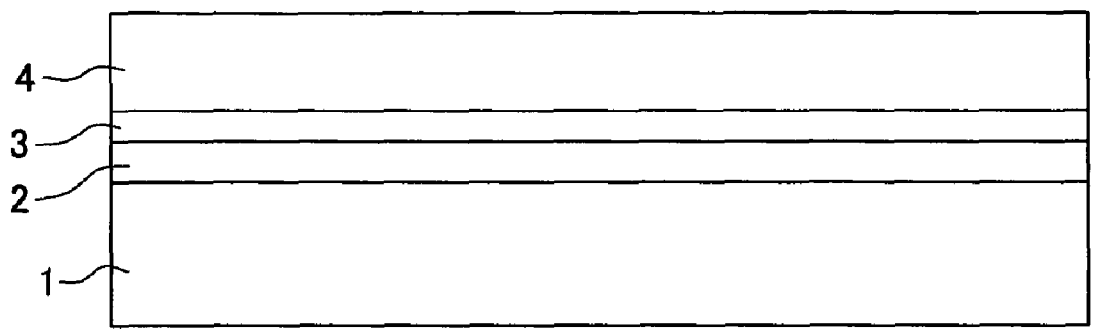
FIG. 1 is a sectional view showing one manufacturing stage of a semiconductor device according to an embodiment of the present invention.

Referring to FIG. 1, an active region and an isolation region can be defined on a semiconductor substrate 1. In one embodiment, a device isolation layer can be formed on the semiconductor substrate (not shown). In a specific embodiment, a LOCOS or a shallow trench isolation (STI) process can be performed on the isolation region to form the device isolation layer. Referring again to FIG. 1, a gate insulating layer 2 can be formed on the entire surface of the semiconductor substrate 1.

Then, an amorphous silicon layer 3 can be formed on the gate insulating layer 2. In a specific embodiment, the amorphous silicon layer 3 is 50 sccm -2000 sccm of silane (SiH4) that can be deposited at a temperature of 500° C.-550° C. with a pressure of 10 Pa to 100 Pa.

Afterwards, a polycrystalline silicon layer 4 can be formed on the amorphous silicon layer 3. In a specific embodiment, the polycrystalline silicon layer 4 is 50 sccm-2000 sccm of silane (SiH4) that can be deposited at a temperature of 590° C.-650° C. with a pressure of 10 Pa to 100 Pa.

In one embodiment, the amorphous silicon layer 3 can be formed thinner than the polycrystalline silicon layer 4 in order for the polycrystalline silicon layer 4 to be the layer mainly used for the gate electrode.

Figure 2:
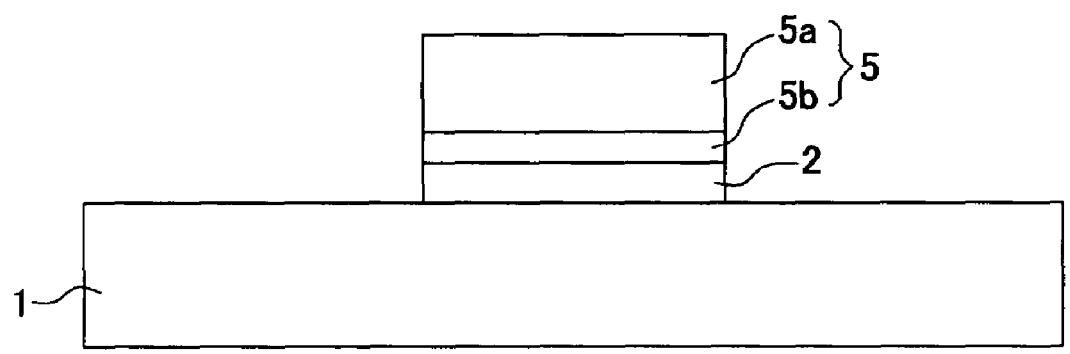
FIG. 2 is a sectional view showing a next stage after the stage in FIG. 1.

Then, as shown in FIG. 2, the polycrystalline silicon layer 4 and the amorphous silicon layer 3 can be etched such that a gate electrode 5 including an upper layer 5a and a lower layer 5b is formed.

Next, the gate insulating layer can be removed. In one embodiment, the gate electrode 5 can be used as a mask, and the exposed gate insulating layer 2 can be removed. In another embodiment, the gate electrode can be further masked, and the exposed gate insulating layer 2 can be removed.

Figure 3:
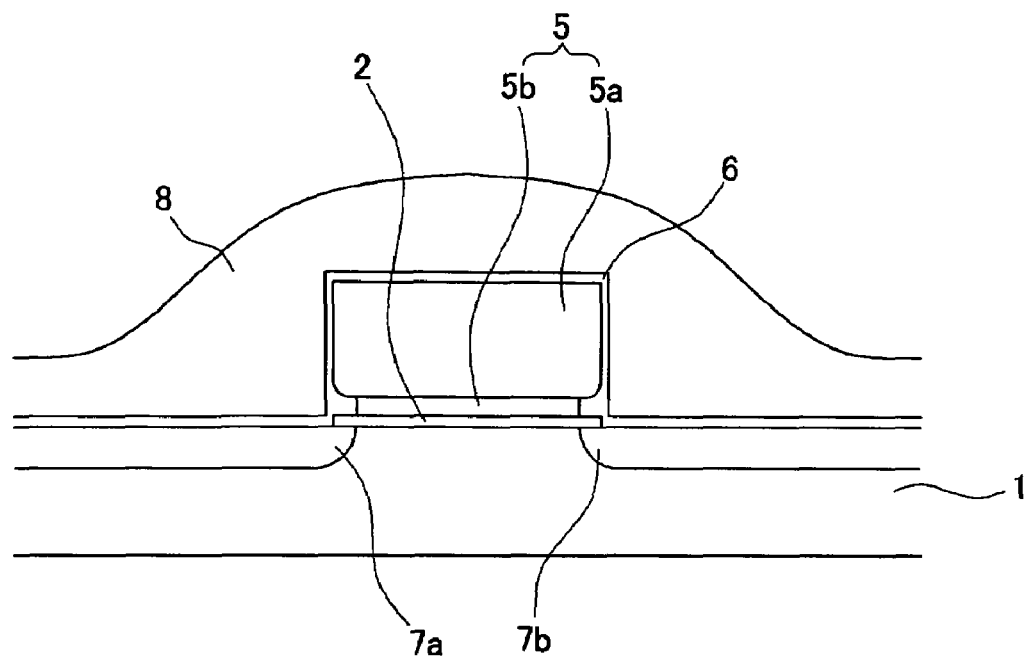
FIG. 3 is a sectional view showing a following stage after the stage in FIG. 2.

Then, as shown in FIG. 3, the entire surface of the semiconductor substrate 1 can be heat-treated to form oxide layer 6. The oxide layer 6 can be formed on top of the exposed semiconductor substrate 1 and the gate electrode 5. In a specific embodiment, the oxide layer 6 can be formed thicker in the lower layer 5b of the gate electrode, which includes amorphous silicon with a relatively higher oxidation rate, than in the upper layer 5a of the gate electrode 5, which includes polycrystalline silicon with a relatively lower oxidation rate.

Accordingly, because the oxidation rate of the lower layer 5b of the gate electrode 5 is relatively high, the lower layer 5b reacts with the oxide layer 6 such that its sides oxidize at a higher rate than the upper layer 5a, causing the lower layer 5b to become narrower than the upper layer 5a.

Therefore, the lower layer 5b of the gate electrode 5 can be located only on the channel region of the semiconductor substrate 1, with the gate insulating layer 2 between. In particular, regions overlapping low density impurity regions 7a and 7b (to be later formed at the edges on either side of the lower layer 5b of the gate electrode 5) do not exist.

Next, impurity ions can be implanted into the semiconductor substrate 1 to form low density impurity regions 7a and 7b. Then, a nitride layer 8 can be applied to the resulting substrate.

In embodiments, the low density impurity regions 7a and 7b can be formed by implanting n-type or p-type impurity ions. The low density impurity regions can provide a lightly doped drain (LDD) region at either side of the gate electrode 5.

Figure 4:
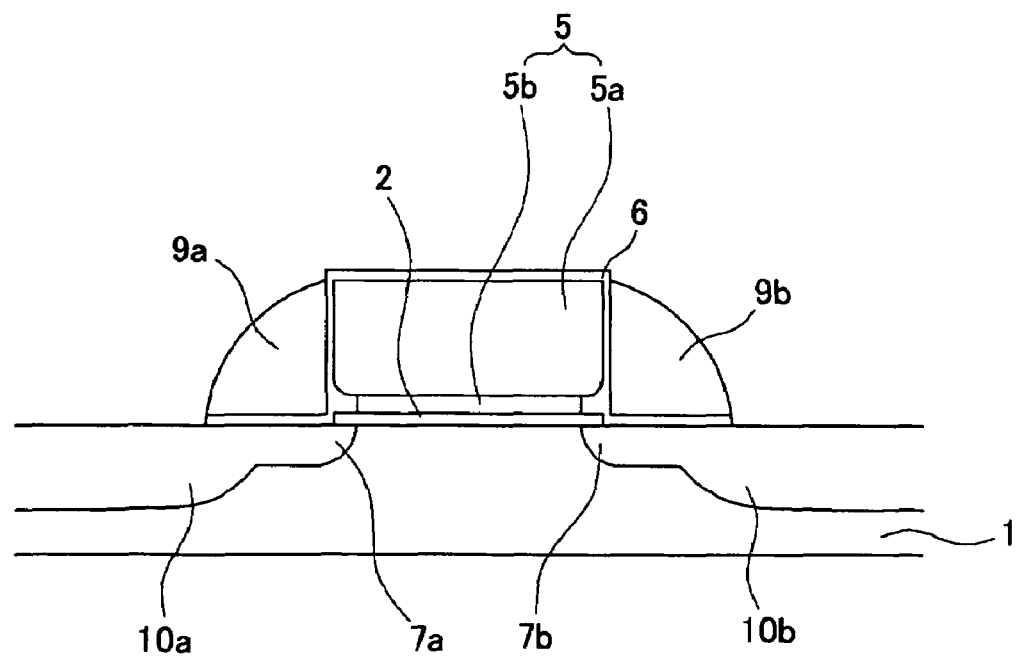
FIG. 4 is a sectional view showing a subsequent stage after the stage in FIG. 3.

Next, as shown in FIG. 4, the nitride layer 8 and the oxide layer 6 can be etched through photolithography to form sidewalls 9a and 9b. Then, in one embodiment the gate electrode 5 and the sidewalls 9a and 9b can be used as a mask for implanting impurities into the substrate. In an alternative embodiment, the gate electrode 5 and the sidewalls 9a and 9b can be further covered with a mask. Accordingly, n-type or p-type impurities can be implanted to form high density impurity regions such as source region 10a and drain region 10b.

As described above, by providing the gate electrode 5 with a lower layer 5b having a higher oxidation rate than an upper layer 5a, a relatively thick oxide layer 6 can be formed on the lower layer 5b between the source region 10a and the drain region 10b. Embodiments of the subject invention can prevent the gate electrode 5 from overlapping the source region 10a and the drain region 10b. Accordingly, current leaking from the transistor due to the movement of electrons can be prevented, and the reliability of the semiconductor device increases.

The method of manufacturing a semiconductor device according to the present invention includes forming a gate electrode with an upper and lower layer having different oxidation rates. Therefore, ion impurity regions in the semiconductor substrate can be further apart from the gate electrode and current leaking from the transistor can be prevented. Accordingly, and the reliability and capability of the semiconductor device can be increased.

It will be apparent to those skilled in the art that various modifications and variations can be made in the present invention. Thus, it is intended that the present invention covers the modifications and variations of this invention provided they come within the scope of the appended claims and their equivalents.

I claim:

1. A semiconductor device, comprising:
   a substrate;
   a gate insulating layer formed on the substrate;
   a gate electrode comprising an upper layer and a lower layer stacked on the gate insulating layer, wherein the lower layer of the gate electrode is formed of amorphous silicon;
   an oxide layer on the gate electrode having a portion formed from the gate electrode; and
   a sidewall formed on the gate electrode.

2. The semiconductor device of claim 1, wherein the lower layer is formed of a material having a higher oxidation rate than the upper layer.

3. The semiconductor device of claim 1, wherein the upper layer and the lower layer have different oxidation rates, respectively.

4. The semiconductor device of claim 1, wherein the amorphous silicon is formed with a flowrate of silane gas between 50 sccm and 2000 sccm, at a temperature between 500° C. and 550° C., and under a pressure between 10 Pa and 100 Pa.

5. The semiconductor device of claim 1, wherein the upper layer of the gate electrode comprises polycrystalline silicon.

6. The semiconductor device of claim 5, wherein the polycrystalline silicon is formed with a flowrate of silane gas between 50 sccm and 2000 sccm, at a temperature between 590° C. and 650° C., and under a pressure between 10 Pa and 100 Pa.

7. The semiconductor device of claim 1, wherein the upper layer is thicker than the lower layer.

8. The semiconductor device of claim 1, wherein the lower layer of the gate electrode has a narrower width than that of the upper layer of the gate electrode.

9. The semiconductor device of claim 1, further comprising an impurity ion region on the semiconductor substrate at both sides of the gate electrode.

10. The semiconductor device of claim 9, wherein the lower layer of the gate electrode is located between the impurity ion regions such that the lower layer does not overlap with the impurity ion regions.

11. A method of manufacturing a semiconductor device, comprising:
    forming a gate insulating layer on a substrate;
    forming a lower layer and an upper layer on the gate insulating layer;

etching the upper layer and the lower layer to form a gate electrode;

etching the gate insulating layer by using only the gate electrode as a mask;

forming an oxide layer by performing a heat treatment on the substrate and the gate electrode; and forming a high density impurity region by implanting impurity ions into the semiconductor substrate.

12. The method of claim 11, wherein the upper and the lower layers have different oxidation rates, respectively.

13. The method of claim 11, wherein the upper layer is polycrystalline silicon, and the lower layer is amorphous silicon.

14. The method of claim 13, wherein the upper layer is formed with a flowrate of silane gas between 50 sccm and 2000 sccm, at a temperature between 590° C. and 650° C., and under a pressure between 10 Pa and 100 Pa.

15. The method of claim 13, wherein the lower layer is formed with a flowrate of silane gas between 50 sccm and 2000 sccm, at a temperature between 500° C. and 550° C., and under a pressure between 10 Pa and 100 Pa.

16. The method of claim 11, wherein the lower layer has a narrower width than that of the upper layer.

17. The method of claim 11, further comprising forming a low density impurity region by implanting impurity ions into the semiconductor substrate.

18. The method of claim 17, wherein the low density impurity region is formed at both sides of the gate electrode.

19. The method of claim 11, further comprising:

forming a nitride layer on the oxide layer; and forming sidewalls by etching the oxide layer and the nitride layer.

* * * * *

UNITED STATES PATENT AND TRADEMARK OFFICE
CERTIFICATE OF CORRECTION

PATENT NO.       : 7,361,580 B2                          Page 1 of 1
APPLICATION NO.  : 11/473693
DATED            : April 22, 2008
INVENTOR(S)      : Jae Yuhn Moon It is certified that error appears in the above-identified patent and that said Letters Patent is hereby corrected as shown below:

Title Page
Item (75),
Inventor, "Moon Jae Yuhn" should read --Jae Yuhn Moon--.

Signed and Sealed this

Thirtieth Day of September, 2008

JON W. DUDAS
*Director of the United States Patent and Trademark Office*